(12) United States Patent
Rui et al.

(10) Patent No.: US 10,971,500 B2
(45) Date of Patent: Apr. 6, 2021

(54) METHODS USED IN THE FABRICATION OF INTEGRATED CIRCUITRY

(71) Applicant: Micron Technology, Inc., Boise, ID (US)

(72) Inventors: Ying Rui, Meridian, ID (US); Tong Liu, Boise, ID (US); Yi Fang Lee, Boise, ID (US); Davide Colombo, Boise, ID (US); Silvia Borsari, Boise, ID (US); Austin Johnson, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 16/433,966

(22) Filed: Jun. 6, 2019

(65) Prior Publication Data
US 2020/0388622 A1    Dec. 10, 2020

(51) Int. Cl.
*H01L 27/108* (2006.01)
*H01L 49/02* (2006.01)
*H01L 21/768* (2006.01)
*H01L 27/11502* (2017.01)

(52) U.S. Cl.
CPC .. *H01L 27/10855* (2013.01); *H01L 21/76838* (2013.01); *H01L 27/10888* (2013.01); *H01L 27/11502* (2013.01); *H01L 28/60* (2013.01)

(58) Field of Classification Search
None
See application file for complete search history.

(56) References Cited

U.S. PATENT DOCUMENTS

| | | | |
|---|---|---|---|
| 8,871,107 B2* | 10/2014 | Fuller | H01L 21/76885 216/78 |
| 9,257,638 B2* | 2/2016 | Tan | C23F 1/12 |
| 9,779,519 B2* | 10/2017 | Barnett | G06T 11/001 |
| 9,799,519 B1* | 10/2017 | Joseph | H01L 21/76862 |

* cited by examiner

*Primary Examiner* — Bradley Smith
(74) *Attorney, Agent, or Firm* — Wells St. John P.S.

(57) ABSTRACT

A method used in fabrication of integrated circuitry comprises forming metal material outwardly of a substrate. At least a majority (i.e., up to and including 100%) of the metal material contains ruthenium in at least one of elemental-form, metal compound-form, or alloy-form. A masking material is formed outwardly of the ruthenium-containing metal material. The masking material comprises at least one of nine specifically enumerated materials or category of materials. The masking material is used as a mask while etching through an exposed portion of the ruthenium-containing metal material to form a feature of integrated circuitry that comprises the ruthenium-containing metal material.

23 Claims, 6 Drawing Sheets

METHODS USED IN THE FABRICATION OF INTEGRATED CIRCUITRY

TECHNICAL FIELD

Embodiments disclosed herein pertain to methods used in the fabrication of integrated circuitry.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The digitlines may conductively interconnect memory cells along columns of the array, and the access lines may conductively interconnect memory cells along rows of the array. Each memory cell may be uniquely addressed through the combination of a digitline and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1. In other systems, at least some individual memory cells may be configured to store more than two levels or states of information.

A capacitor is one type of electronic component that may be used in a memory cell. A capacitor has two electrical conductors separated by electrically insulating material. Energy as an electric field may be electrostatically stored within such material. Depending on composition of the insulator material, that stored field will be volatile or non-volatile. For example, a capacitor insulator material including only $SiO_2$ will be volatile. One type of non-volatile capacitor is a ferroelectric capacitor which has ferroelectric material as at least part of the insulating material. Ferroelectric materials are characterized by having two stable polarized states and thereby can comprise programmable material of a capacitor and/or memory cell. The polarization state of the ferroelectric material can be changed by application of suitable programming voltages and remains after removal of the programming voltage (at least for a time). Each polarization state has a different charge-stored capacitance from the other, and which ideally can be used to write (i.e., store) and read a memory state without reversing the polarization state until such is desired to be reversed. Less desirable, in some memory having ferroelectric capacitors the act of reading the memory state can reverse the polarization. Accordingly, upon determining the polarization state, a re-write of the memory cell is conducted to put the memory cell into the pre-read state immediately after its determination. Regardless, a memory cell incorporating a ferroelectric capacitor ideally is non-volatile due to the bi-stable characteristics of the ferroelectric material that forms a part of the capacitor. Other programmable materials may be used as a capacitor insulator to render capacitors non-volatile.

Ruthenium has been proposed as a conductive material for use in electronic components and as parts thereof. Ruthenium may be formed into desired shape(s) by forming a patterned masking material there-over and then anisotropically etching away the unmasked portion(s) of the ruthenium. In such instances, common masking material comprises carbon and the etching chemistry comprises oxygen. Unfortunately, oxygen-containing etching chemistries etch carbon in addition to ruthenium. Accordingly, need remains for alternate or additional masking materials when etching ruthenium.

DETAILED DESCRIPTION OF EXAMPLE EMBODIMENTS

Embodiments disclosed herein include methods used in the fabrication of integrated circuitry including, for example, methods of forming a conductive line structure of integrated circuitry. First example embodiments are shown and described with reference to FIGS. 1-4.

Figure 1:
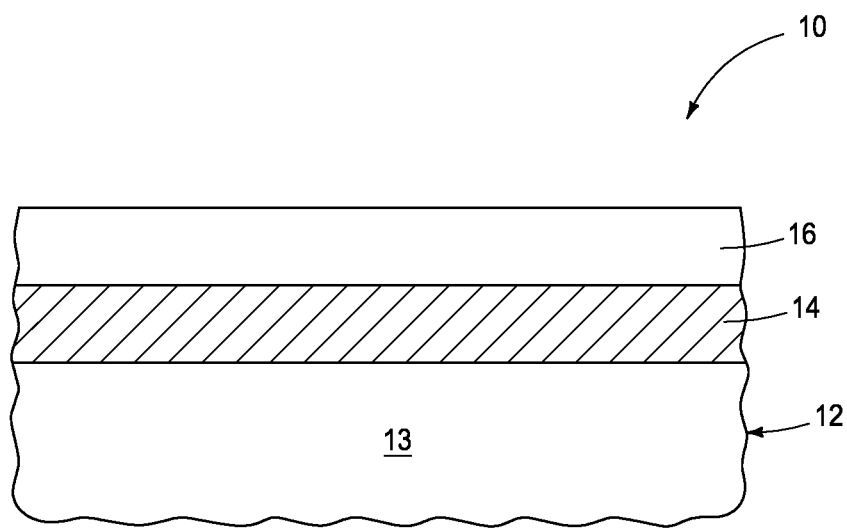
FIG. 1 is a diagrammatic cross-sectional view of a portion of a construction in process in accordance with some embodiments of the invention.

Referring to FIG. 1, such shows part of a construction 10 comprising a base substrate 12 having any one or more of conductive/conductor/conducting, semiconductive/semi-conductor/semiconducting, or insulative/insulator/insulating (i.e., electrically herein) material(s) 13. Various materials have been formed elevationally over base substrate 12. Materials may be aside, elevationally inward, or elevationally outward of the FIG. 1-depicted materials. For example, other partially or wholly fabricated components of integrated circuitry may be provided somewhere above, about, or within base substrate 12.

A metal material 14 has been formed outwardly of base substrate 12. At least a majority of the metal material contains ruthenium in at least one of elemental-form, metal compound-form, or alloy-form. In one embodiment, metal material 14 may consist essentially of, or consist of, ruthenium in at least one of elemental-form, metal compound-form, or alloy-form.

A masking material 16 has been formed outwardly of ruthenium-containing metal material 14. Masking material 16 comprises at least one of:
- a refractory metal, other than ruthenium, that is in at least one of elemental-form or alloy-form;
- a refractory metal nitride other than RuN;
- a refractory metal oxide other than $RuO_2$ and $RuO_4$;
- a refractory metal silicide other than $Ru_2Si$, $Ru_4Si_3$, RuSi, and $Ru_2Si_3$;
- a refractory metal carbide other than RuC;
- aluminum in at least one of elemental-form or alloy-form;
- $AlN_x$;
- $AlO_x$; or
- $AlC_x$.

In this document, a "refractory metal" is any of titanium, vanadium, chromium, manganese, zirconium, niobium, molybdenum, technetium, ruthenium, rhodium, hafnium, tantalum, tungsten, rhenium, osmium, or iridium.

In one embodiment, the masking material comprises the refractory metal other than ruthenium that is in at least one of elemental-form or alloy-form. In one embodiment, the masking material comprises the refractory metal nitride other than RuN. In one embodiment, the masking material comprises the refractory metal oxide other than $RuO_2$ and $RuO_4$. In one embodiment, the masking material comprises the refractory metal silicide other than $Ru_2Si$, $Ru_4Si_3$, RuSi, and $Ru_2Si_3$. In one embodiment, the masking material comprises the refractory metal carbide other than RuC. In one embodiment, the masking material comprises the aluminum in at least one of elemental-form or alloy-form. In one embodiment, the masking material comprises the $AlN_x$. In one embodiment, the masking material comprises the $AlO_x$. In one embodiment, the masking at comprises the $AlC_x$. In one embodiment, the masking material comprises more than one of said above-listed nine materials or category of materials. In one embodiment, the masking material comprises one of hafnium, titanium, tantalum, or tungsten. In one embodiment, the masking material comprises TiN.

Figure 2:
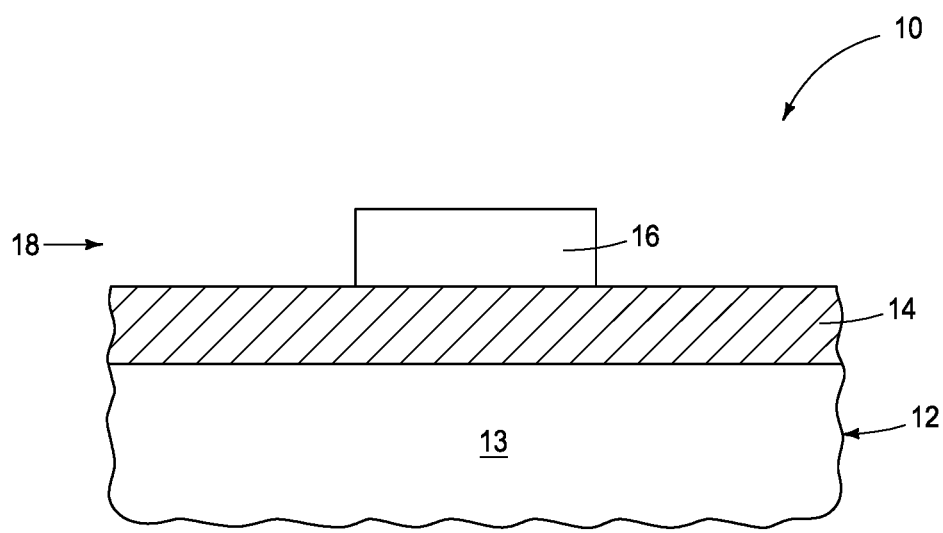
FIGS. 2-4 are diagrammatic sequential sectional views of the construction of FIG. 1 in process in accordance with some embodiments of the invention.

Referring to FIG. 2 and in one embodiment, masking material 16 has been patterned (e.g., using photolithography and/or pitch multiplication) to form a mask 18, with example mask 18 ultimately having some portion(s) of ruthenium-containing metal material 14 covered and leaving some outwardly (e.g. upwardly) exposed. Masking material 16 of mask 18 may be of any suitable shape(s) for forming a feature that comprises ruthenium-containing metal material 14 as will be apparent from the continuing discussion.

Figure 3:
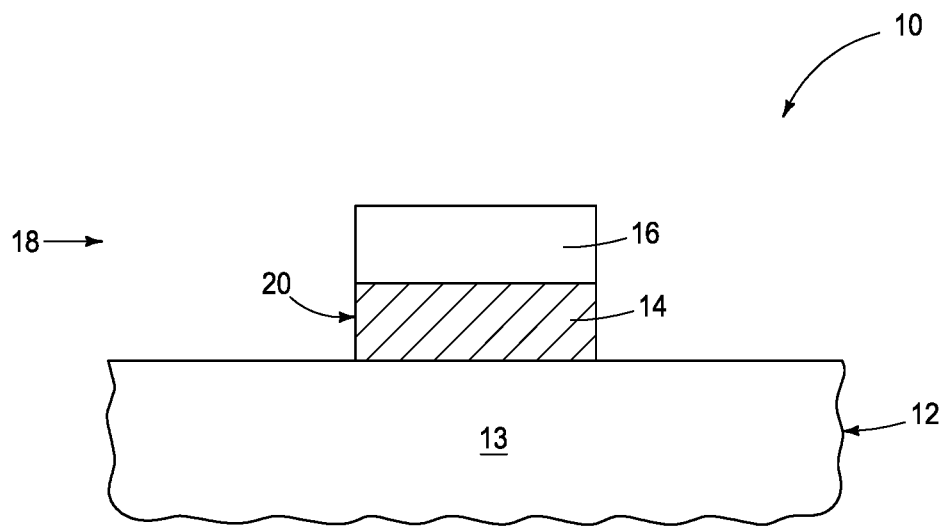

Referring to FIG. 3, masking material 16 of mask 18 has been used as a mask while etching through an exposed portion of ruthenium-containing metal material 14 to form a feature 20 of integrated circuitry that comprises ruthenium-containing metal material 14. Any existing or future-developed etching chemistries may be used, for example feed gases such as $O_2$ and/or $Cl_2$ in combination with an inert gas such as Ar or He, and with or without plasma. Any existing or future-developed feature, component, or part of a component of integrated circuitry may be fabricated, for example all or part of conductive vias, conductive lines, resistors, diodes, transistors, amplifiers, memory cells, etc. In one embodiment, feature 20 comprises a horizontally-elongated conductive line (e.g., extending into and out of the page upon which FIG. 3 lies). In one embodiment, feature 20 comprises a digitline of memory circuitry, for example memory circuitry that comprises DRAM and as described below in one example embodiment.

Figure 4:
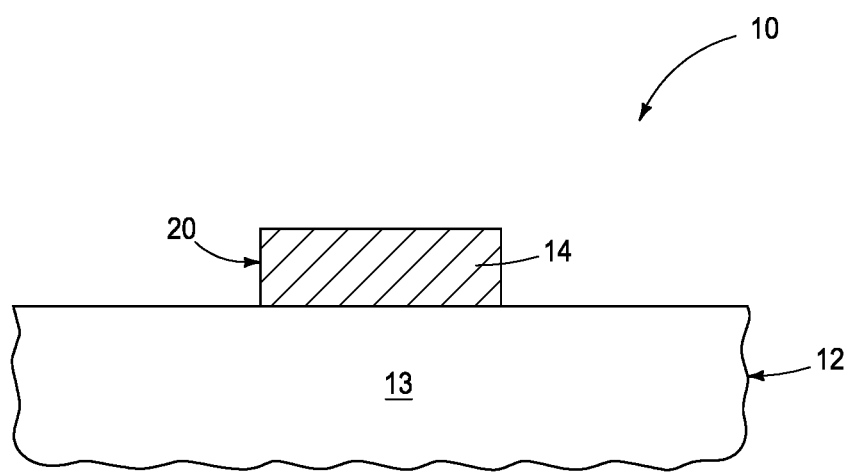

Masking material 16 may be, and would typically be, removed from construction 10 whereby such does not comprise a part of the finished integrated circuitry construction, with FIG. 4 by way of example showing removal of masking material 16 (not shown). Alternately, some or all of masking material may remain as part of the finished integrated circuitry construction. Regardless, any other attribute(s) or aspect(s) as shown and/or described herein with respect to other embodiments may be used.

In one embodiment and as shown, masking material 16 during the etching shown by FIG. 3 consists essentially of, or consists of, the at least one of:
- a refractory metal other than ruthenium that is in at least one of elemental-form or alloy-form;
- a refractory metal nitride other than RuN;
- a refractory metal oxide other than $RuO_2$ and $RuO_4$;
- a refractory metal silicide other than $Ru_2Si$, $Ru_4Si_3$, RuSi, and $Ru_2Si_3$;
- a refractory metal carbide other than RuC;
- aluminum in at least one of elemental-form or alloy-form;
- $AlN_x$;
- $AlO_x$; or
- $AlC_x$.

In one such embodiment, masking material 16 has a minimum thickness of at least 100 Angstroms.

Figure 5:
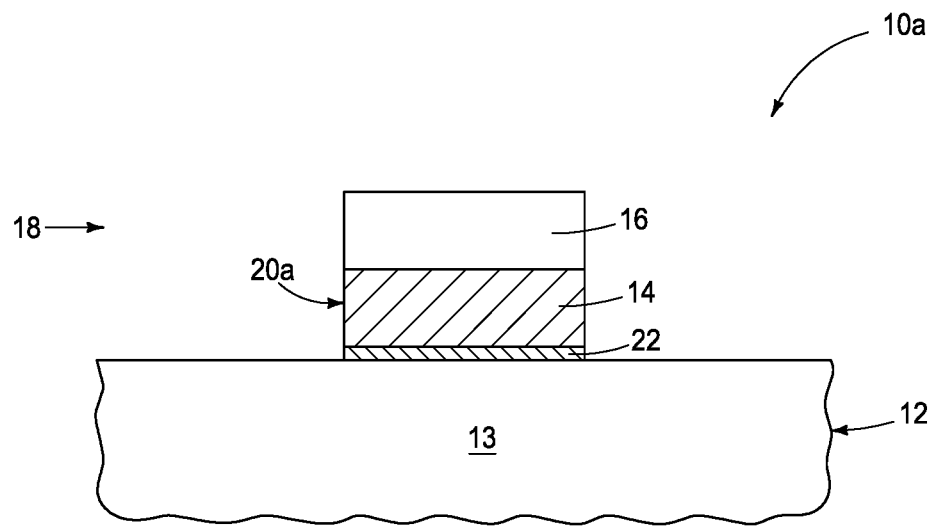
FIG. 5 is a diagrammatic cross-sectional view of a portion of a construction in process in accordance with some embodiments of the invention.

An alternate example method embodiment in accordance with the invention is next described with reference to FIG. 5. Such corresponds in processing sequence to that of FIG. 3 of the first-described embodiments and has resulted in fabrication of a construction 10a. Like numerals from the above-described embodiments have been used where appropriate, with some construction differences being indicated with the suffix "a" or with different numerals. Such shows an example embodiment wherein a conductive material 22 of a composition other than ruthenium-containing metal material 14 has been provided between such material 14 and substrate 12. In one embodiment, conductive material 22 comprises a refractory metal nitride other than RuN. In some such embodiments, conductive material 22 may be considered as a first refractory metal nitride. In one embodiment, masking material 16 comprises a refractory metal nitride other than RuN, and which in some embodiments may be considered as a second refractory metal nitride. In one embodiment where masking material 16 comprises a refractory metal nitride other than RuN, masking material 16 comprises the same refractory metal nitride as that of conductive material 22. In one embodiment where masking material 16 comprises a refractory metal nitride other than RuN, masking material 16 comprises a different refractory metal nitride than that of conductive material 22. Regardless, in one embodiment, the refractory metal nitride of masking material 16 has a minimum thickness that is at least twice that (about six times that as shown) of the refractory metal nitride of conductive material 22. Providing such a thin layer of refractory metal nitride 22 in comparison to that of masking material 16 allows feature 20a to be formed by etching through conductive material 22 while consuming masking material 16, and assuming the selectivity in the etch to produce construction 10a of FIG. 5 is not 100% selective to not remove any of masking material 16 during such etching. Regardless, and in one embodiment, the refractory metal nitride of materials 16 and 22 comprises TiN. Any other attribute(s) or aspect(s) as shown and/or described herein with respect to other embodiments may be used.

Figure 6:
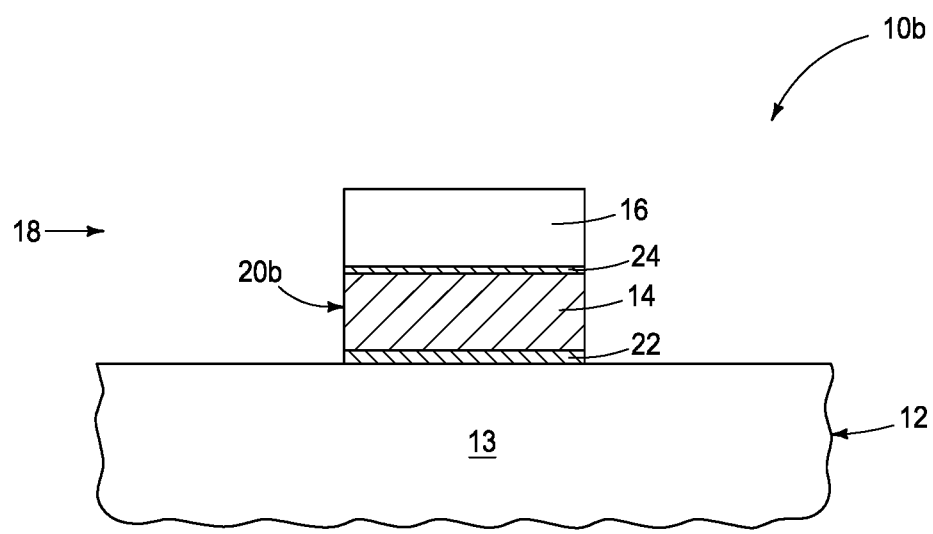
FIG. 6 is a diagrammatic cross-sectional view of a portion of a construction in process in accordance with some embodiments of the invention.

An alternate example method embodiment in accordance with the invention is next described with reference to FIG. 6. Such corresponds in processing sequence to those of FIGS. 3 and 5 of the above-described embodiments and has resulted in fabrication of a construction 10b comprising a feature 20b. Like numerals from the above-described embodiments have been used where appropriate, with some construction differences being indicated with the suffix "b" or with different numerals. Construction 10b is similar to construction 10a of FIG. 5 and additionally provides a conductive material 24 (other than RuN) vertically between masking material 16 and ruthenium-containing metal material 14. In one embodiment, conductive material 24 comprises a conductive metal nitride other than RuN. FIG. 6 also shows an embodiment wherein the etching using masking material 16 as a mask has comprised etching through conductive material 24. In one embodiment where materials 22 and 24 are each refractory metal nitrides, such are of the same composition relative one another and in another embodiment are of different compositions relative one another. In one embodiment where conductive material 24 comprises a refractory metal nitride and as shown, such has maximum thickness (e.g., 10 Angstroms) that is less than maximum thickness (e.g., 50 Angstroms) of example metal nitride material 22. In one embodiment, each of masking material 16, conductive material 24, and conductive material 22 comprise refractory metal nitrides. In one such embodiment, the refractory metal nitrides of each of materials 16, 24, and 22 are of the same composition relative one another. In another embodiment, at least two of the refractory metal nitrides of materials 16, 24, and 22 are of different composition relative one another, and in one such embodiment all three of the refractory metal nitrides of each of materials 16, 24, and 22 are of different compositions relative one another.

In one embodiment, masking material 16 during the etching consists essentially of a refractory metal nitride other than RuN, masking material 16 has a minimum thickness of at least 100 Angstroms, conductive material 22 comprises a refractory metal nitride other than RuN and has a maximum thickness of no greater than about 80 Angstroms, and conductive material 24 comprises a refractory metal nitride having a maximum thickness such that sum of the refractory-metal-nitride-maximum thickness of material 22 and the refractory-metal-nitride-maximum thickness of material 24 is no greater than 100 Angstroms, and in one embodiment wherein the sum is no greater than 60 Angstroms.

Any other attribute(s) or aspect(s) as shown and/or described herein with respect to other embodiments may be used.

Figure 7:
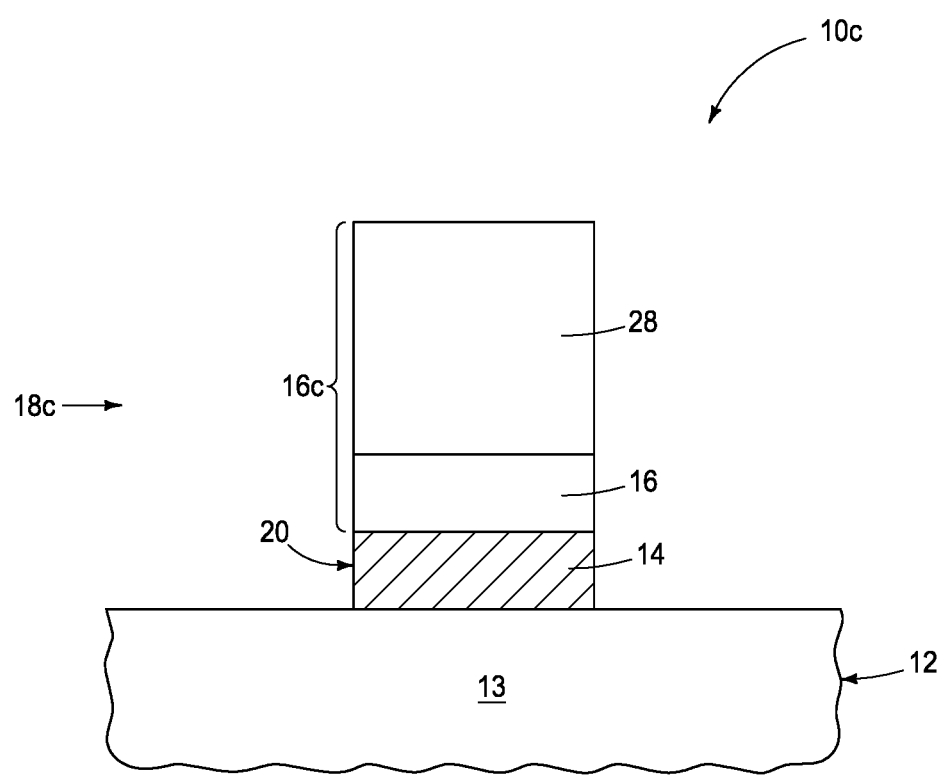
FIG. 7 is a diagrammatic cross-sectional view of a portion of a construction in process in accordance with some embodiments of the invention.

An alternate example method embodiment in accordance with the invention is next described with reference to FIG. 7. Such corresponds in processing sequence to those of FIGS. 3, 5, and 6 of the above-described embodiments and has resulted in fabrication of a construction 10c. Like numerals from the above-described embodiments have been used where appropriate, with some construction differences being indicated with the suffix "c" or with different numerals. FIG. 7 shows an example wherein a masking material 28, for example carbon, has been provided atop masking material 16 resulting in masking material 16c of a mask 18c. FIG. 7 shows using masking material 16c of mask 18c as a mask while etching of ruthenium-containing metal material 14 to form feature 20 that comprises ruthenium-containing metal material 14. Any other attribute(s) or aspect(s) as shown and/or described herein with respect to other embodiments may be used.

An alternate example method embodiment in accordance with the invention is next described with reference to FIGS. 8-11, for example in a method of forming a conductive line structure of integrated circuitry. Such corresponds in processing sequence to that of FIGS. 2 and 3 of the first-described embodiments. Like numerals from the above-described embodiments have been used where appropriate, with some construction differences being indicated with the suffix "d" or with different numerals.

Figure 8:
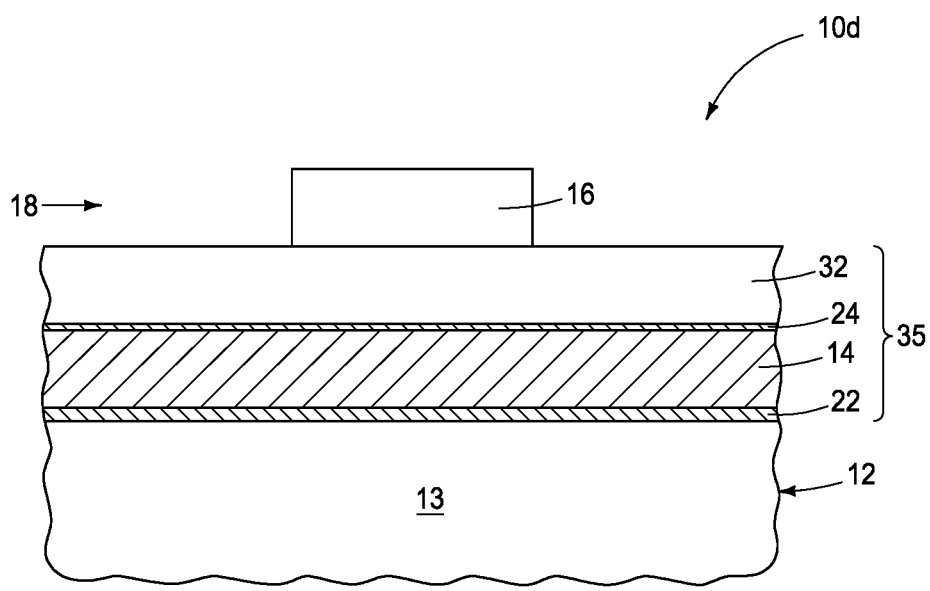
FIG. 8 is a diagrammatic cross-sectional view of a portion of a construction in process in accordance with some embodiments of the invention.

Referring to FIG. 8, a vertical stack 35 has been formed in a construction 10d and that comprises a first refractory metal nitride 22 other than RuN, a metal material 14 vertically outward of first refractory metal nitride 22, and an insulator material 32 (e.g., silicon nitride and/or silicon dioxide) vertically outward of metal material 14. In one example embodiment and as shown, a third refractory metal nitride 24 is also formed as part of vertical stack 35. At least a majority of metal material 14 contains ruthenium in at least one of elemental-form, metal compound-form, or alloy-form.

Masking material 16 has been formed vertically outward of insulator material 32. Masking material 16 comprises at least one of:
 a refractory metal, other than ruthenium, that is in at least one of elemental-form or alloy-form;
 a second refractory metal nitride other than RuN;
 a refractory metal oxide other than $RuO_2$ and $RuO_4$;
 a refractory metal silicide other than $Ru_2Si$, $Ru_4Si_3$, RuSi, and $Ru_2Si_3$;
 a refractory metal carbide other than RuC;
 aluminum in at least one of elemental-form or alloy-form;
 $AlN_x$;
 $AlO_x$; or
 $AlC_x$.

In one embodiment, masking material 16 comprises the second refractory metal nitride, and first refractory metal nitride 22 and the second refractory metal nitride are of the same composition relative one another and in another embodiment are of different compositions relative one another.

Figure 9:
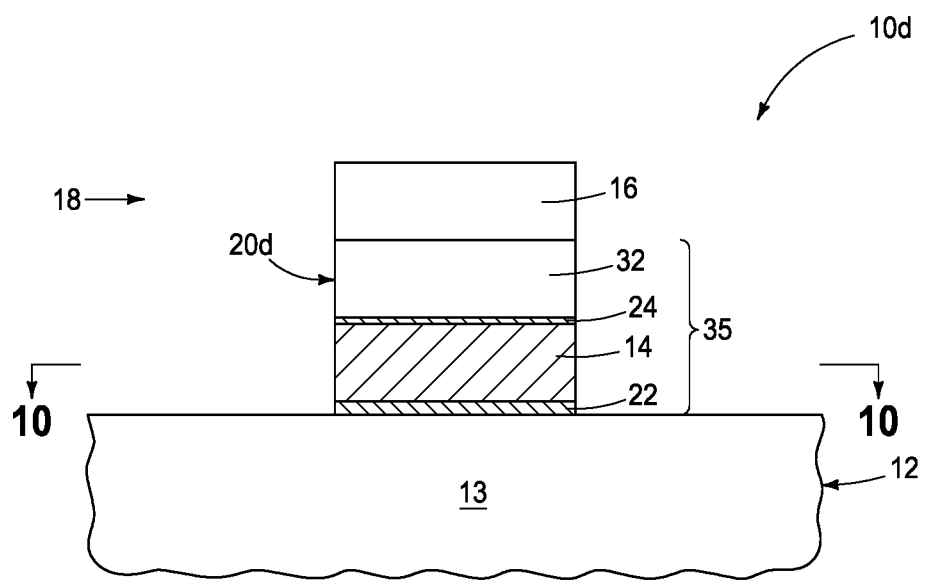
FIG. 9 is a view of FIG. 8 construction at a processing step subsequent to that shown by FIG. 8 and is taken through line 9-9 in FIG. 10.
Figure 10:
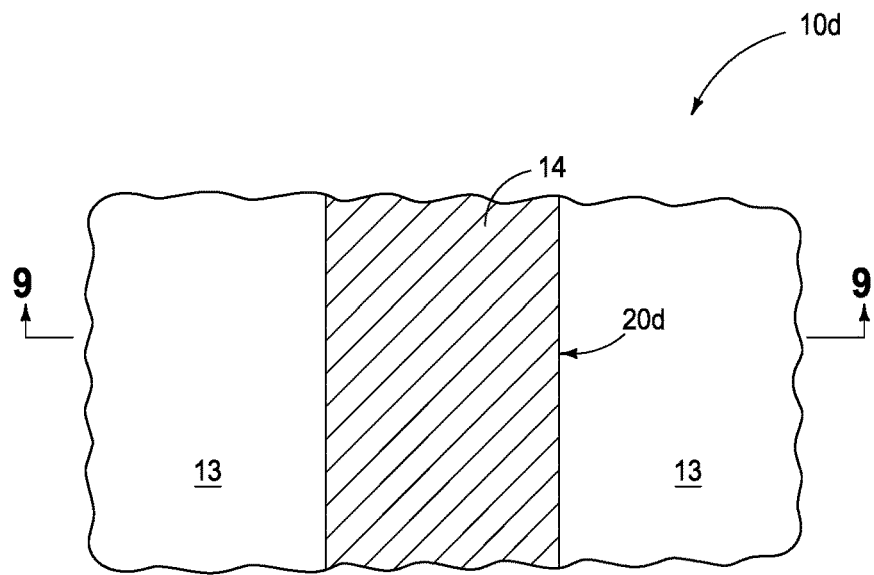
FIG. 10 is a cross-sectional view through line 10-10 in FIG. 9.

Referring to FIGS. 9 and 10, masking material 16 of mask 18 has been used as a mask while etching through an exposed portion of insulator material 16, ruthenium-containing metal material 14 (and third refractory metal nitride 24 when present), and first refractory metal nitride 22 to form a conductive line structure 20d comprising insulator material 32, third refractory metal nitride 24 (when present), ruthenium-containing metal material 14, and first refractory metal nitride 22. Any other attribute(s) or aspect(s) as shown and/or described herein with respect to other embodiments may be used.

Figure 11:
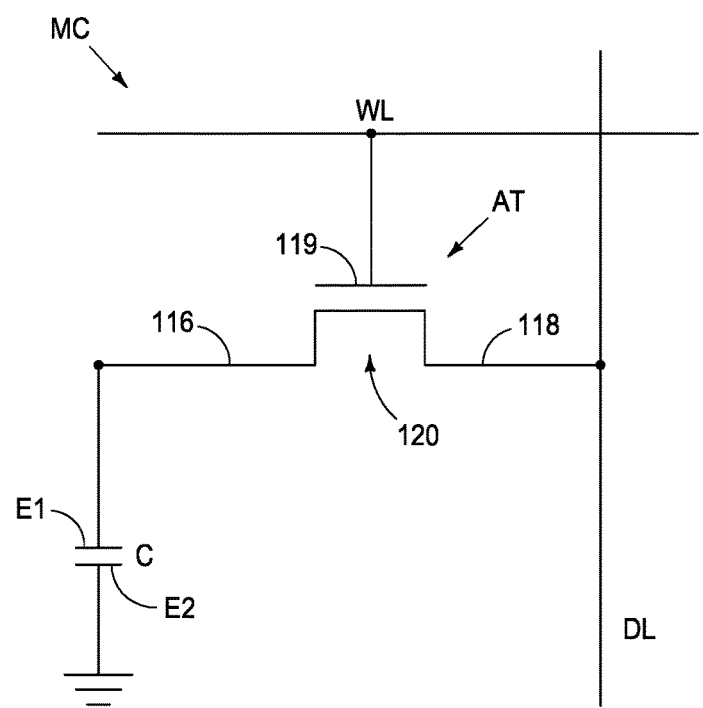
FIG. 11 is a diagrammatic schematic of memory integrated circuitry manufactured in accordance with an embodiment of the invention.

In one embodiment, conductive line structure 20d comprises a digitline of memory circuitry, for example DRAM circuitry. For example, and by way of example only, FIG. 11 shows a portion of DRAM circuitry comprising a memory cell MC that comprises an access transistor AT having a pair of source/drain regions 116 and 118, a channel region 120, and a gate 119 directly electrically coupled to and thereby comprising a wordline WL. A gate insulator (not shown) would be between wordline WL/gate 119 and channel region 120. Memory cell MC comprises a capacitor C having one of its electrodes (e.g., E1) directly electrically coupled to one of source/drain regions 116, 118 (116 as shown). Another capacitor electrode (e.g., E2) opposing the one capacitor electrode may be a common capacitor electrode among all capacitors in a memory array and may be directly electrically coupled to ground, as shown, or to some other suitable potential. The other of source/drain regions 116, 118 (118 as shown) is directly electrically coupled to a digitline DL (e.g., conductive material of a conductive line structure 20d, or any of features 20a, 20b, or 20d when such comprise a conductive line). Any other attribute(s) or aspect(s) as shown and/or described herein with respect to other embodiments may be used.

In one embodiment, a method used in fabrication of integrated circuitry comprises forming metal material outwardly of a substrate. At least a majority of the metal material contains ruthenium in at least one of elemental-form, metal compound-form, or alloy-form. A masking material is formed outwardly of the ruthenium-containing metal material and comprising TiN. The TiN-comprising masking material is used as a mask while etching through an exposed portion of the ruthenium-containing metal material to form a feature of integrated circuitry that comprises the ruthenium-containing metal material. Any other attribute(s) or aspect(s) as shown and/or described herein with respect to other embodiments may be used.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45 from exactly horizontal.

Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

The composition of any of the conductive/conductor/conducting materials herein may be metal material and/or conductively-doped semiconductive/semiconductor/semiconducting material. "Metal material" is any one or combination of an elemental metal, any mixture or alloy of two or more elemental metals, and any one or more conductive metal compound(s).

Herein, "selective" as to etch, etching, removing, removal, depositing, forming, and/or formation is such an act of one stated material relative to another stated material(s) so acted upon at a rate of at least 2:1 by volume. Further, selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a method used in fabrication of integrated circuitry comprises forming metal material outwardly of a substrate. At least a majority (i.e., up to and including 100%) of the metal material contains ruthenium in at least one of elemental-form, metal compound-form, or alloy-form. A masking material is formed outwardly of the ruthenium-containing metal material. The masking material comprises at least one of:
 a refractory metal, other than ruthenium, that is in at least one of elemental-form or alloy-form;
 a refractory metal nitride other than RuN;
 a refractory metal oxide other than $RuO_2$ and $RuO_4$;
 a refractory metal silicide other than $Ru_2Si$, $Ru_4Si_3$, RuSi, and $Ru_2Si_3$; a refractory metal carbide other than RuC;
 aluminum in at least one of elemental-form or alloy-form;
 $AlN_x$;
 $AlO_x$; or
 $AlC_x$.

The masking material is used as a mask while etching through an exposed portion of the ruthenium-containing metal material to form a feature of integrated circuitry that comprises the ruthenium-containing metal material.

In some embodiments, a method used in fabrication of integrated circuitry comprises forming metal material outwardly of a substrate. At least a majority of the metal material contains ruthenium in at least one of elemental-form, metal compound-form, or alloy-form. A masking material is formed outwardly of the ruthenium-containing metal material. The masking material comprises TiN and the TiN-comprising masking material is used as a mask while etching through an exposed portion of the ruthenium-containing metal material to form a feature of integrated circuitry that comprises the ruthenium-containing metal material.

In some embodiments, a method of forming a conductive line structure of integrated circuitry comprises forming a vertical stack comprising a first refractory metal nitride other than RuN. A metal material is vertically outward of first the refractory metal nitride and an insulator material is vertically outward of the metal material. At least a majority of the metal material contains ruthenium in at least one of elemental-form, metal compound-form, or alloy-form. A masking material is formed vertically outward of the insulator material. The masking material comprises at least one of:
 a refractory metal, other than ruthenium, that is in at least one of elemental-form or alloy-form;
 a second refractory metal nitride other than RuN;
 a refractory metal oxide other than $RuO_2$ and $Ru_4$;
 a refractory metal silicide other than $Ru_2Si$, $Ru_4Si_3$, RuSi, and $Ru_2Si_3$; a refractory metal carbide other than RuC;
 aluminum in at least one of elemental-form or alloy-form;
 $AlN_x$;
 $AlO_x$; or
 $AlC_x$.

The masking material is used as a mask while etching through an exposed portion of the insulator material, the ruthenium-containing metal material, and the first refractory metal nitride to form a conductive line structure comprising the insulator material, the ruthenium-containing metal material, and the first refractory metal nitride.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method used in fabrication of integrated circuitry, comprising:
 forming a conductive material outwardly of a substrate, the conductive material having a first thickness and comprising a refractory metal nitride other than RuN;
 forming metal material outwardly of and in direct physical contact with the conductive material; at least a majority of the metal material containing ruthenium in at least one of elemental-form, metal compound-form, or alloy-form;
 forming a masking material outwardly of the ruthenium-containing metal material, the masking material having a second thickness at least twice the first thickness and comprising at least one of:
  a refractory metal, other than ruthenium, that is in at least one of elemental-form or alloy-form;
  a refractory metal nitride other than RuN;
  a refractory metal oxide other than $RuO_2$ and $RuO_4$;
  a refractory metal silicide other than $Ru_2Si$, $Ru_4Si_3$, RuSi, and $Ru_2Si_3$;
  a refractory metal carbide other than RuC;
  aluminum in at least one of elemental-form or alloy-form;
  $AlN_x$;
  $AlO_x$; or
  $AlC_x$; and
 in an absence of additional material over the masking material, using the masking material as a mask while etching an exposed portion of the ruthenium-containing metal material to form a feature of integrated circuitry that comprises the ruthenium-containing metal material, the etching using an etch chemistry comprising an inert gas in combination with at least one feed gas selected from $O_2$ and $Cl_2$.

2. The method of claim 1 wherein the masking material comprises the refractory metal other than ruthenium that is in at least one of elemental-form or alloy-form.

3. The method of claim 1 wherein the masking material comprises the refractory metal nitride other than RuN.

4. The method of claim 1 wherein the masking material comprises the refractory metal oxide other than $RuO_2$ and $RuO_4$.

5. The method of claim 1 wherein the masking material comprises the refractory metal silicide other than $Ru_2Si$, $Ru_4Si_3$, RuSi, and $Ru_2Si_3$.

6. The method of claim 1 wherein the masking material comprises the refractory metal carbide other than RuC.

7. The method of claim 1 wherein the masking material comprises the aluminum in at least one of elemental-form or alloy-form.

8. The method of claim 1 wherein the masking material comprises the $AlN_x$.

9. The method of claim 1 wherein the masking material comprises the $AlO_x$.

10. The method of claim 1 wherein the masking material comprises the $AlC_x$.

11. The method of claim 1 wherein the masking material comprises one of hafnium, titanium, tantalum, or tungsten.

12. The method of claim 1 wherein the masking material comprises TiN.

13. The method of claim 1 comprising removing all remaining of the masking material after the removing the exposed portion of the ruthenium-containing material.

14. The method of claim 1 wherein the masking material comprises the same refractory metal nitride as that of the conductive material.

15. The method of claim 14 wherein the refractory metal nitride comprises TiN.

16. The method of claim 1 wherein the masking material comprises a different refractory metal nitride than that of the conductive material.

17. The method of claim 1 wherein the masking material during the etching consists essentially of the at least one of:
the refractory metal other than ruthenium that is in at least one of elemental-form or alloy-form;
the refractory metal nitride other than RuN;
the refractory metal oxide other than $RuO_2$ and $RuO_4$;
the refractory metal silicide other than $Ru_2Si$, $Ru_4Si_3$, RuSi, and $Ru_2Si_3$;
the refractory metal carbide other than RuC;
aluminum in at least one of elemental-form or alloy-form;
$AlN_x$;
$AlO_x$; or
$AlC_x$.

18. The method of claim 17 wherein the masking material has a minimum thickness of at least 100 Angstroms.

19. The method of claim 1 wherein the feature comprises a horizontally-elongated conductive line.

20. The method of claim 1 wherein the metal material consists essentially of ruthenium in at least one of elemental-form, metal compound-form, or alloy-form.

21. The method of claim 1 wherein the metal material consists of ruthenium in at least one of elemental-form, metal compound-form, or alloy-form.

22. A method used in fabrication of integrated circuitry, comprising:
forming metal material outwardly of a substrate; at least a majority of the metal material containing ruthenium in at least one of elemental-form, metal compound-form, or alloy-form;
forming a masking material outwardly of the ruthenium-containing metal material, the masking material comprising at least one of:
a refractory metal, other than ruthenium, that is in at least one of elemental-form or alloy-form;
a refractory metal nitride other than RuN;
a refractory metal oxide other than $RuO_2$ and $RuO_4$;
a refractory metal silicide other than $Ru_2Si$, $Ru_4Si_3$, RuSi, and $Ru_2Si_3$;
a refractory metal carbide other than RuC;
aluminum in at least one of elemental-form or alloy-form;
$AlN_x$;
$AlO_x$; or
$AlC_x$;
forming a carbon mask outwardly of the masking material; and
using the carbon mask and masking material as a mask while etching removing an exposed portion of the ruthenium-containing metal material to form a feature of integrated circuitry that comprises the ruthenium-containing metal material, the etching using an etch chemistry comprising an inert gas in combination with at least one feed gas selected from $O_2$ and $Cl_2$.

23. A method of forming a conductive line structure of integrated circuitry, comprising:
forming a vertical stack comprising a first refractory metal nitride other than RuN, a metal material vertically outward of first the refractory metal nitride, and an insulator material vertically outward of the metal material; at least a majority of the metal material containing ruthenium in at least one of elemental-form, metal compound-form, or alloy-form;
forming a masking material vertically outward of and directly against the insulator material, the masking material comprising at least one of:
a refractory metal, other than ruthenium, that is in at least one of elemental-form or alloy-form, the refractory metal being selected from the group consisting of chromium, manganese, zirconium, molybdenum, technetium, ruthenium, rhodium, hafnium, tungsten, rhenium, osmium, or iridium;
a second refractory metal nitride other than RuN, the refractory metal nitride comprising a refractory metal selected from group consisting of vanadium, chromium, manganese, zirconium, niobium, molybdenum, technetium, ruthenium, rhodium, hafnium, tungsten, rhenium, osmium, or iridium;
a refractory metal oxide other than $RuO_2$ and $RuO_4$;
a refractory metal silicide other than $Ru_2Si$, $Ru_4Si_3$, RuSi, and $Ru_2Si_3$;
a refractory metal carbide other than RuC;
aluminum in at least one of elemental-form or alloy-form;
$AlN_x$;
$AlO_x$; or
$AlC_x$; and
using the masking material as a mask while etching an exposed portion of the insulator material, the ruthenium-containing metal material, and the first refractory metal nitride to form a conductive line structure comprising the insulator material, the ruthenium-containing metal material, and the first refractory metal nitride, the etching using an etch chemistry comprising an inert gas in combination with at least one feed gas selected from $O_2$ and $Cl_2$.

* * * * *